US012690299B1

(12) United States Patent
Zhang et al.

(10) Patent No.: US 12,690,299 B1
(45) Date of Patent: Jul. 21, 2026

(54) GROUP III NITRIDE LIGHT EMITTING DIODE WITH AN ELECTRON BLOCKING STRUCTURE

(71) Applicant: BOLB Inc., Livermore, CA (US)

(72) Inventors: Jianping Zhang, Arcadia, CA (US); Ying Gao, Beijing (CN); Ling Zhou, Dublin, CA (US); Bin Zhang, Livermore, CA (US)

(73) Assignee: BOLB Inc., Livermore, CA (US)

( * ) Notice: Subject to any disclaimer, the term of this patent is extended or adjusted under 35 U.S.C. 154(b) by 487 days.

(21) Appl. No.: 18/348,330

(22) Filed: Jul. 6, 2023

(51) Int. Cl.
| | |
|---|---|
| *H01L 33/32* | (2010.01) |
| *H10H 20/812* | (2025.01) |
| *H10H 20/816* | (2025.01) |
| *H10H 20/825* | (2025.01) |

(52) U.S. Cl.
CPC ...... *H10H 20/8252* (2025.01); *H10H 20/812* (2025.01); *H10H 20/8162* (2025.01)

(58) Field of Classification Search
CPC ............. H10H 20/8252; H10H 20/812; H10H 20/8162
See application file for complete search history.

(56) References Cited

U.S. PATENT DOCUMENTS

| | | | |
|---|---|---|---|
| 9,219,189 | B2 | 12/2015 | Northrup et al. |
| 2008/0037701 | A1 | 2/2008 | Banks |
| 2015/0179881 | A1 | 6/2015 | Sénès et al. |
| 2023/0013312 | A1* | 1/2023 | Matsukura ......... H10H 20/8215 |

* cited by examiner

*Primary Examiner* — Mohammed R Alam
(74) *Attorney, Agent, or Firm* — Cooley LLP

(57) ABSTRACT

A light emitting diode has a substrate, a group III nitride layer over the substrate for electron supply and n-type ohmic contact formation and a light-emitting multiple-quantum well active region over the group III nitride layer. An electron blocking layer is over the light-emitting multiple-quantum well active region, the electron blocking layer has a periodic structure made of a $Al_xGa_{1-x}N$ barrier layer and a $Al_yGa_{1-y}N$ well layer and a laminate comprising an $Al_xGa_{1-x}N$ layer of thickness b1, an Al-composition down-graded $Al_zGa_{1-z}N$ layer of thickness b, and an $Al_yGa_{1-y}N$ layer of thickness b3, where b is greater than each of b1 and b3. A p-contact layer is positioned above the electron blocking layer and a p-contact pad is positioned above the p-contact layer.

9 Claims, 13 Drawing Sheets

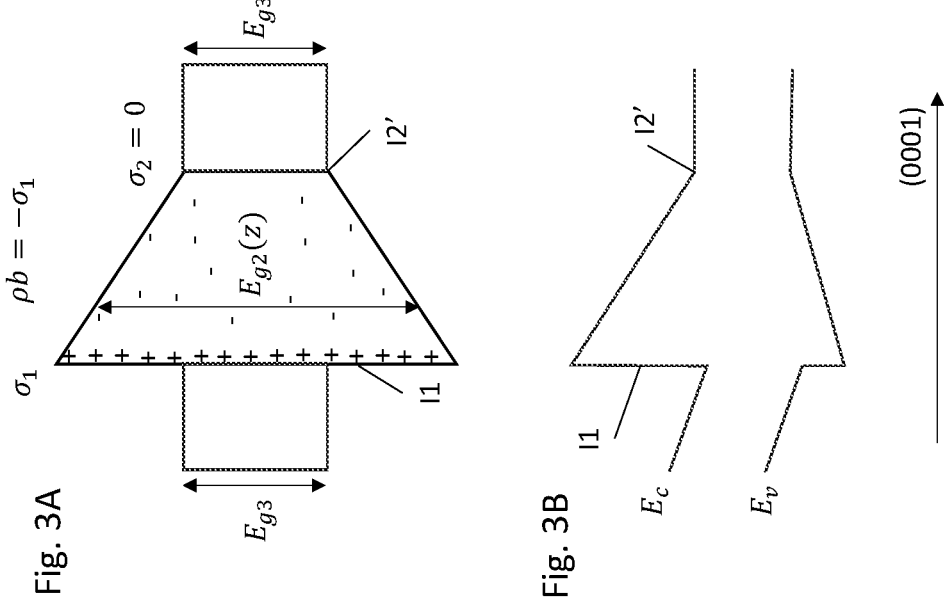
Fig. 3A
Fig. 3B
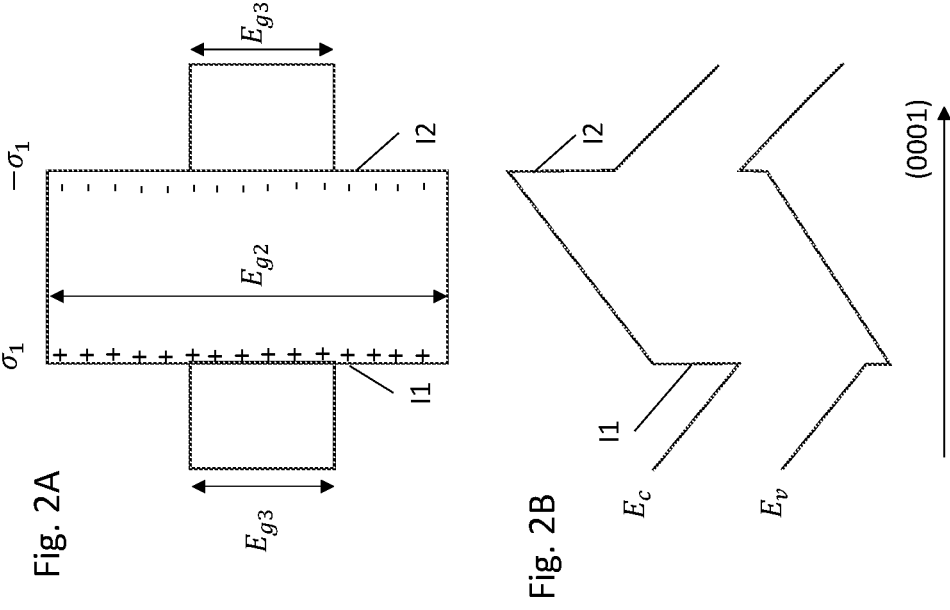
Fig. 2A
Fig. 2B

An ELB embodiment according to this invention

GROUP III NITRIDE LIGHT EMITTING DIODE WITH AN ELECTRON BLOCKING STRUCTURE

FIELD OF THE INVENTION

The present disclosure relates in general to a group III nitride light emitting diode, more particularly, to electron blocking structures of group III nitride light emitting diodes.

BACKGROUND OF THE INVENTION

Group III nitride semiconductors, including InN, GaN, AlN and their ternary (e.g., $Al_xGa_{1-x}N$, $In_yGa_{1-y}N$, $Al_zIn_{1-z}N$) and quaternary ($Al_xIn_yGa_{1-x-y}N$) alloys, enable light emissions covering the full visible spectrum (400-700 nm) and part of the ultraviolet (UV) spectrum including UVA (315-400 nm), UVB (280-315 nm), and UVC (200-280 nm) bands. Visible and UVA light-emitting diodes (LEDs) are based on GaN/InGaN heterostructures, though occasionally employing some $Al_xGa_{1-x}N$/GaN heterostructures but generally the Al-composition is limited to x≤0.25. Visible and UVA LEDs have revolutionized the display, curing and general lighting industries. UVB and UVC LEDs because of their shorter emissions rely on $Al_xGa_{1-x}N$/$Al_yGa_{1-y}N$ heterostructures, with x, y≥0.3 in general, and these LEDs are expected to transform the phototherapy and solid-state disinfection industries.

A UV LED includes an n-type AlGaN structure, a p-type AlGaN structure, and a light-emitting structure (called active-region) commonly made of AlGaN multiple-quantum-well (MQW) sandwiched in-between the n-type and p-type AlGaN structures. An AlGaN structure can be made of an AlGaN layer or many AlGaN layers to deliver a better function, such as to improve material quality, conductivity and/or carrier confinement. An important part of the p-type AlGaN structure is an electron blocking layer or structure (EBL), which is designed to provide sufficient energy barrier to suppress electron overflow from the light-emitting MQW active-region to the p-type AlGaN structure. For this purpose, the bandgap of the EBL has to be larger than that of the light-emitting MQW. The bandgap ($E_g$) of a semiconductor is the energy difference measured from its conduction band ($E_c$) to its valence band ($E_v$), i.e., $E_g=E_c-E_v$. For an $Al_xGa_{1-x}N$ alloy semiconductor, the bandgap is determined by its Al-composition (x). The EBL for a larger bandgap therefore must have higher Al-composition as compared to the MQW active-region, resulting in a heterointerface between the MQW active-region and the EBL. On the other hand, because of the polarization characteristics of the group III nitrides, a nitride heterointerface likely bears polarization charges, proportional to the polarization discontinuity. Depending on the sheet density, these interface charges can have a pronounced effect on the barrier height of the heterointerface. For an example, when a c-plane $Al_yGa_{1-y}N$ layer is epitaxially deposited on a c-plane $Al_xGa_{1-x}N$ layer (assume y>x), a heterostructure $Al_yGa_{1-y}N$/$AlGa_{1-x}N$ is formed, with positive polarization charges accumulated on the heterointerface. These interface charges will reduce heterointerface barrier height for electrons (band tilting). If the barrier height of the EBL is not optimal, an LED can suffer from short lifespan and efficiency loss at higher injection currents.

The band tilting effect of the polarization charges can be mitigated via proper dopants, provided that the dopants can be ionized and, hence introduce sufficient free carriers to screen the electric field generated by the polarization charges. In general, n-type dopants in AlGaN are easier to ionize as compared to p-type dopants. This makes the band tilting effect of an n-type AlGaN heterostructure easier to mitigate. For p-type heterostructures, the band tilting effect due to heterointerface charges is not easy to mitigate, as p-type dopants in AlGaN materials have high activation energy (much higher than the room-temperature thermal energy). Hence, a proper design of p-type heterostructures is of critical importance to the LED performance.

In the prior art, different composition profiles of EBL have been discussed and disclosed. For example, an EBL composition grading up then grading down profile has been disclosed in the US patent application publication Nos. US20080137701 and US20150179881, and some EBL Al-composition grading down profiles have been disclosed in the U.S. Pat. No. 9,219,189. More scientific solid EBL designs are needed to enable UVC LEDs of exceptional performance.

SUMMARY

A light emitting diode has a substrate, a group III nitride layer over the substrate for electron supply and n-type ohmic contact formation and a light-emitting multiple-quantum well active region over the group III nitride layer. An electron blocking layer is over the light-emitting multiple-quantum well active region, the electron blocking layer has a periodic structure made of a $Al_xGa_{1-x}N$ barrier layer and a $Al_yGa_{1-y}N$ well layer and a laminate comprising an $Al_xGa_{1-x}N$ layer of thickness b1, an Al-composition down-graded $Al_zGa_{1-z}N$ layer of thickness b, and an $Al_yGa_{1-y}N$ layer of thickness b3, where b is greater than each of b1 and b3. A p-contact layer is positioned above the electron blocking layer and a p-contact pad is positioned above the p-contact layer.

BRIEF DESCRIPTION OF THE DRAWINGS

The accompanying drawings, which are included to provide a further understanding of the invention and constitute a part of this application, illustrate embodiments of the invention and together with the description explain the principle of the invention. Like reference numbers in the figures refer to like elements throughout, and a layer can refer to a group of layers associated with the same function.

FIG. 2A illustrates a bandgap diagram of a laminate structure made of three layers, where each layer is of constant bandgap hence constant composition, respectively, and the mid layer is of higher bandgap and higher polarization.

FIG. 2B illustrates the band structure of the laminate structure shown in FIG. 2A.

FIG. 3A illustrates a bandgap diagram of a laminate structure made of three layers, where the two side layers are of constant bandgap hence constant composition, and the middle layer is of a higher and grading bandgap.

FIG. 3B illustrates the band structure of the laminate structure shown in FIG. 3A.

DETAILED DESCRIPTION

Throughout the specification, the term group III nitride in general refers to metal nitride with cations selecting from group IIIA of the periodic table of the elements. That is to say, group III nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include a small amount of transition metal nitride such as TiN, ZrN, HfN with molar fraction not larger than 10%. For example, group III-nitride or nitride may include $Al_xIn_yGa_zTi_{(1-x-y-z)}N$, $Al_xIn_yGa_zZr_{(1-x-y-z)}N$, $Al_x-In_yGa_zHf_{(1-x-y-z)}N$, with $(1-x-y-z)\leq10\%$.

As well known, light-emitting devices such as light-emitting diodes (LEDs) and laser diodes, commonly adopt a laminate structure containing a quantum well (QW) or multiple-quantum-well (MQW) active regions, an n-type group III nitride structure for injecting electrons into the active region, and a p-type group III nitride structure on the other side of the active region for injecting holes into the active region. The beginning part of the p-type structure, in close proximity to the QW or MQW active region, is considered to be an electron blocking layer or structure (EBL), designed to be of higher bandgap to suppress electron overspill from the active-region into the p-type structure.

Figure 6:
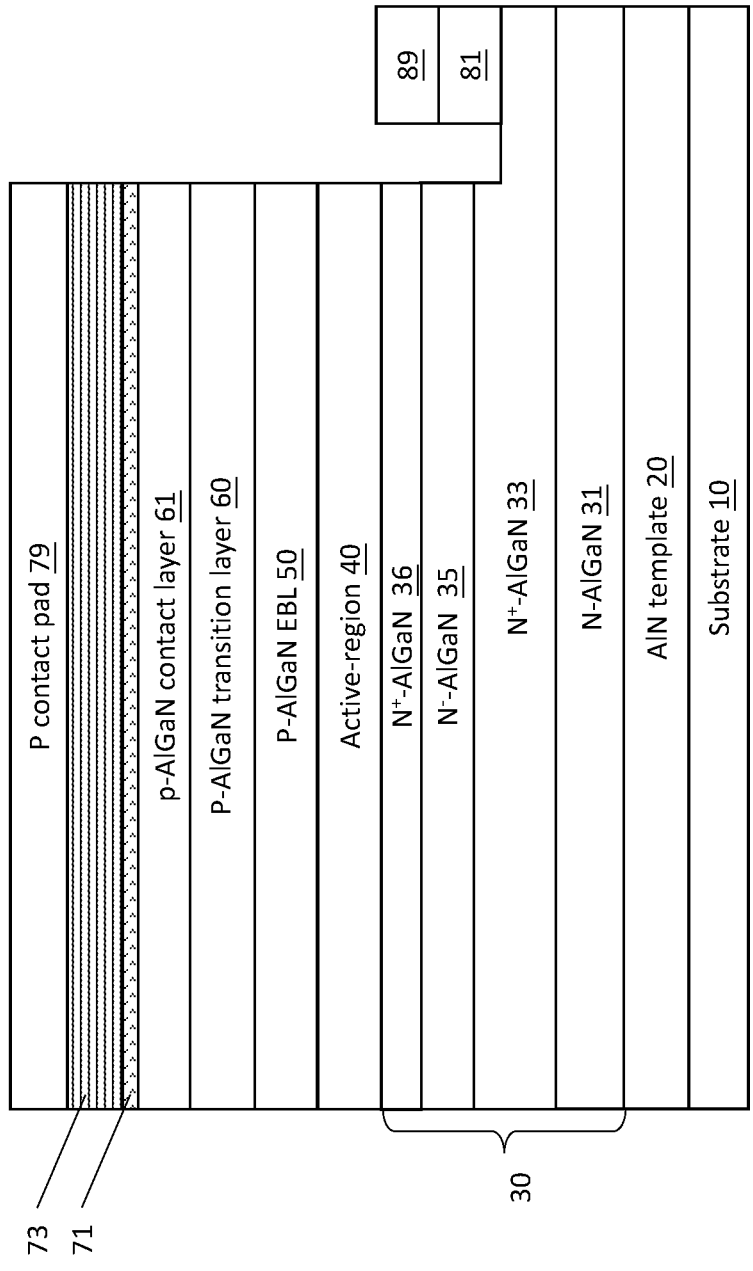
FIG. 6 illustrates a layered structure of a UV LED according to one aspect of the present disclosure.

Referring to an embodiment shown in FIG. 6, an n-type structure 30 and QW or MQW active-region 40 are formed over a substrate 10, and a p-type structure including a p-AlGaN EBL 50, p-transition layer 60 and a p-contact layer 61 is formed on the MQW active-region 40 in sequence. The detailed description of these structures will be discussed later in this specification.

For UVB and UVC LEDs, the electron blocking layers/structures are made of high-Al-content $Al_xGa_{1-x}N$ layers, with $x\geq0.5$, or $x\geq0.6$, or $x\geq0.7$, or $x\geq0.8$, et al. AlGaN materials, especially c-oriented (meaning the growth surface is plane (0001)), are of strong spontaneous polarization and piezoelectric polarization coefficients. For a review of the polarization properties of group III nitrides, one can refer to Edward T. Yu, *III-V Nitride Semiconductors: Applications and Devices* (Chapter 4, Taylor & Francis, 2003). The Yu reference provides polarization coefficients and calculation approaches used in this specification. In general, the polarization vector of group III nitrides is dependent on the crystallographic direction, composition and strain. For a given crystallographic direction, polarization P is a linear function of composition. Once the polarization vector P is obtained (including the spontaneous and piezoelectric components), the polarization charges can be calculated.

Figures 1A, 1B, 1C, 1D:
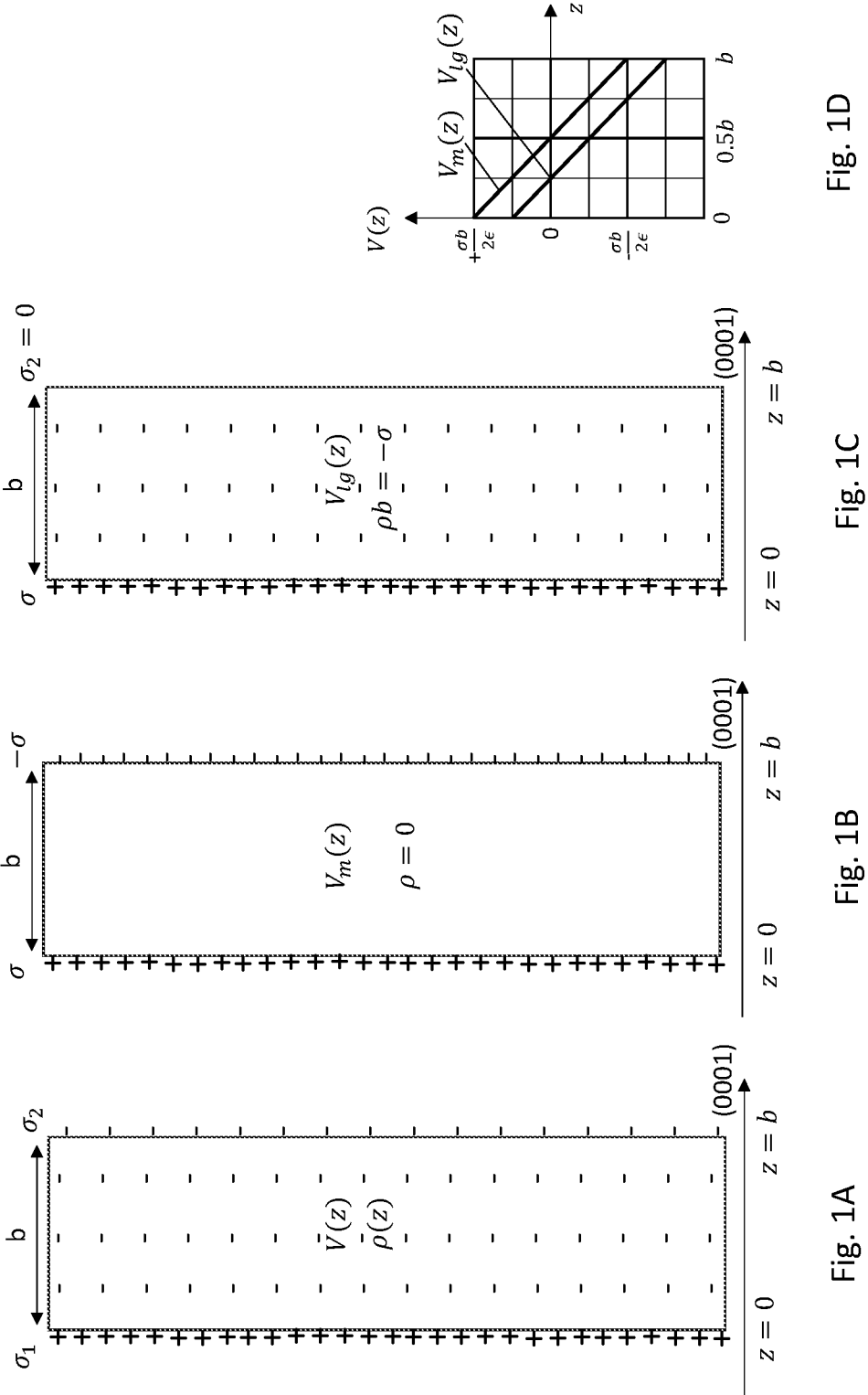
FIG. 1A illustrates an infinite large polarization slab of fine thickness b, with bulk polarization charge density ρ and surface sheet charges $\sigma_1$ and $\sigma_2$.
FIG. 1B illustrates an infinite large polarization slab of fine thickness b, with zero bulk polarization charge and surface sheet charges σ and −σ.
FIG. 1C illustrates an infinite large polarization slab of fine thickness b, with uniform bulk polarization charge density ρ (ρb=−σ) and surface sheet charges σ.
FIG. 1D plots the polarization resulted voltage in the slabs shown in FIGS. 1B and 1C.

For simplicity, in the following, wurtzite c-plane group III nitrides are used to explain the principles outlined in this disclosure. Illustrated in FIG. 1A, consider a c-oriented (i.e., c-direction is parallel to z-direction as shown in FIGS. 1A-1C) group III nitride infinite large polarization film (or slab) of thickness b, bulk polarization charge density $\rho$ and surface sheet charges $\sigma_1$ and $\sigma_2$ on surfaces z=0, and z=b, respectively. The polarization surface charge and bulk charge densities $\sigma$ and $\rho$ are respectively given by:

$$\sigma = P \cdot \hat{n} \tag{1}$$

$$\rho = -\nabla \cdot P \tag{2}$$

where P is the polarization vector, and $\hat{n}$ the surface normal vector. The polarization slab generates a voltage function in space, V(z), given by:

$$V(z) = \frac{1}{4\pi\epsilon}\left[\int\frac{\sigma}{r'}ds + \int\frac{\rho}{r'}d\tau\right] \tag{3}$$

where $\epsilon$ is the electric permittivity. The surface and volume integral terms in eq. (3) above are to be carried out over the slab surface and volume, respectively. If the surface charge density is uniform and the bulk charge density only depends on z, i.e., $\rho=\rho(z)$, then the voltage within the slab ($z\in[0, b]$) can be calculated by:

$$V(z) = -\frac{\sigma_1 z}{2\epsilon} - \frac{\sigma_2(b-z)}{2\epsilon} - \frac{1}{2\epsilon}\int_0^b \rho(z_0)(z-z_0)dz_0 \qquad (4)$$

Eq. (4) can be used to calculate the voltage profile within the slab for any given composition profile. Remember P is a linear function of composition, and $\rho=-\nabla\cdot P$. For example, if the composition is an exponential function of z, then $\rho$ is an exponential function of z; if the composition is a quadratic function of z, then $\rho$ is a linear function of z; if the composition is a linear function of z, then $\rho$ is constant; if the composition is constant, then $\rho=0$.

Consider the polarization slab to be a composition-constant intrinsic c-plane AlInGaN film, as illustrated in FIG. 1B, then there are positive charges $\sigma_1=\sigma$ on surface z=0, negative charges $\sigma_2=-\sigma$ on surface z=b, and $\rho=0$. The voltage within the slab ($z\in[0, b]$) is then given by:

$$V_m(z) = \frac{\sigma b}{2\epsilon} - \frac{\sigma z}{\epsilon} \qquad (5)$$

If the polarization slab is made of Al-composition linearly graded down c-plane AlInGaN (e.g., an $Al_xGaN_{1-x}$ slab and $$\frac{dx}{dz} = -0.0125\,/\,nm,$$

i.e., Al-composition linearly downgraded), then $\sigma_1=\sigma$ on surface z=0, $\sigma_2=0$ on surface z=b, and the bulk polarization charges $\rho$ are uniformly distributed in the slab, and satisfying $\rho b=-\sigma$ (illustrated in FIG. 1C), and the voltage within the slab ($z\in[0, b]$) reads:

$$V_{lg}(z) = \frac{\sigma b}{4\epsilon} - \frac{\sigma z}{\epsilon} \qquad (6)$$

The voltage profiles generated in the slabs in FIGS. 1B and C are plotted in FIG. 1D for comparison. As seen, the polarization charges depending on distribution generate different voltage profiles in the slab, which will modify the energy barrier height if the slab is used as an electron blocking layer (EBL) to block electrons traveling toward the slab along the z-direction. For example, at plane z=0, the EBL barrier height is reduced by $$\frac{e\sigma b}{2\epsilon} \text{ and } \frac{e\sigma b}{4\epsilon}$$

(here e is the electron's elementary charge) for the slabs shown in FIGS. 1B and 1C, respectively. Clearly, the Al-composition linearly downgraded slab suffers much less barrier height loss.

From equations (5) and (6), the Al-composition linearly downgraded slab as compared to the composition constant slab, gains an EBL energy barrier height $\Delta\phi$:

$$\Delta\phi = -e(V_{lg}(z) - V_m(z)) = \frac{e\sigma b}{4\epsilon} \qquad (7)$$

This teaches that an Al-composition linearly downgraded slab can outperform a composition constant slab, when functioning as an electron blocking layer. Further, at surface z=b (refer to FIGS. 1C and 1D), the voltage is more negative for the Al-composition linearly downgraded slab, translating into better hole accumulation capability. Therefore, an improved electron blocking barrier height at surface z=0 (proximate to a multiple-quantum-well active region), together with a better hole accumulation potential well at surface z=b (distal to the multiple-quantum-well active region), makes an Al-composition downgraded AlInGaN slab a better EBL building block.

This is more fully appreciated with reference FIGS. 2A, 2B, 3A, and 3B. FIG. 2A illustrates a bandgap diagram ($E_g=E_c-E_v$) of a laminate structure made of three layers. The two outside well layers have a constant bandgap $E_{g3}$. The middle layer has a higher bandgap ($E_{g2}$) and higher polarization serving as a barrier layer. It is noted that this tri-layer structure is a simple EBL structure, as electrons traveling along c-direction to the barrier layer are blocked by the conduction band discontinuity ($\Delta E_c$) between the barrier and well layers, provided that the polarization generated voltage in the barrier layer is smaller than the $\Delta E_c$.

FIG. 2B illustrates the band structure including conduction band $E_c$ and valence band $E_v$ of the laminate structure shown in FIG. 2A. As seen, due to the polarization generated voltages, the conduction band of the barrier layer is tilted up along a c-direction, and the conduction band of the well layer is tilted down along the c-direction. This is because the electric fields generated by the polarization charges are opposite in sign in the barrier and well layers. Electrons traveling along the c-direction to the barrier layer face reduced barrier height at interface I1, holes traveling along-c-direction at interface I2 have a large injection barrier to overcome.

FIG. 3A illustrates a bandgap diagram of a laminate structure made of three layers, where the two side well layers are of constant bandgap ($E_{g3}$) hence constant composition, and the middle barrier layer has a higher bandgap ($E_{g2}(z)$), which is linearly graded down to that of the well layer, along the c-direction (z-direction). If the middle barrier layer is made of $Al_xGaN_{1-x}$, this means that the Al-composition (x) is linearly downgraded along the c-direction. FIG. 3B illustrates the band structure of the laminate structure shown in FIG. 3A. Because of the gained energy barrier height due to linear grading, this laminate structure possesses higher energy barrier for electrons traveling along c-direction to the middle barrier layer at interface I1, holes traveling along the −c-direction at interface I2' has reduced injection barrier to overcome.

Figure 4:
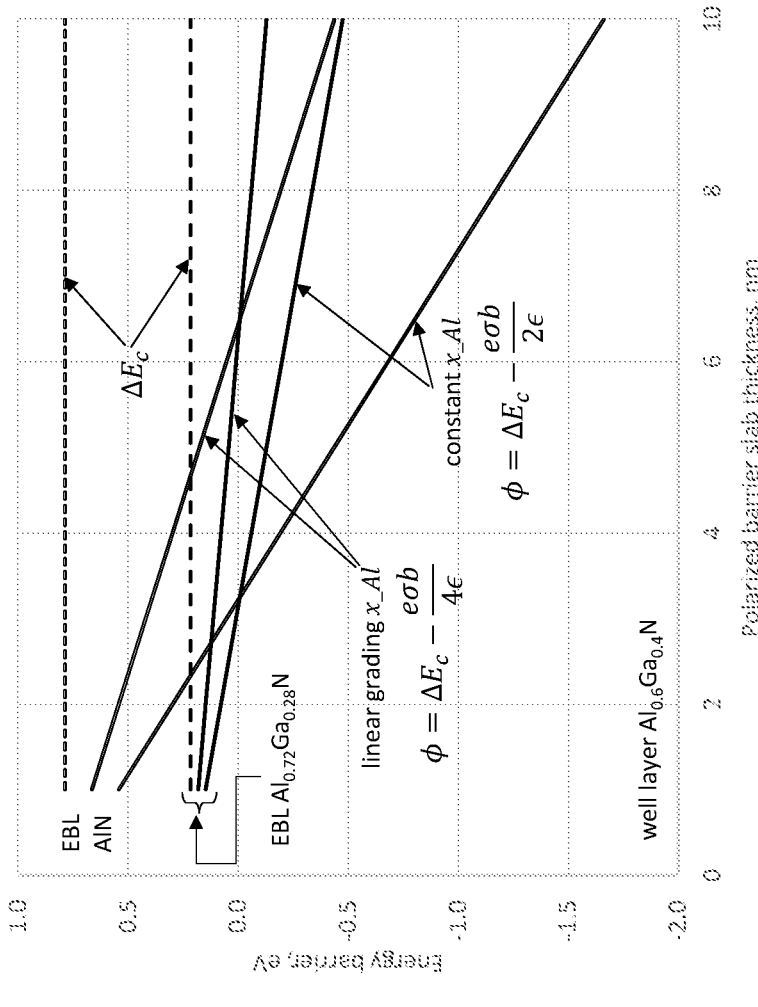
FIG. 4 plots the energy barrier height as function of the thickness of the barrier slabs, where the well layer is $Al_{0.6}Ga_{0.4}$ and the barrier slabs are AlN or $Al_{0.72}Ga_{0.28}$, or AlN or $Al_{0.72}Ga_{0.28}$ linearly graded to $Al_{0.6}Ga_{0.4}$. Also shown as dash lines are the conduction band discontinuities between the AlN or $Al_{0.72}Ga_{0.28}$ barrier slabs and the $Al_{0.6}Ga_{0.4}$ well layer, respectively.

Quantitively, FIG. 4 plots the energy barrier height at interface I1 as function of the barrier slab thickness (b), with the well layer being $Al_{0.6}Ga_{0.4}$ and the barrier slab being AlN or $Al_{0.72}Ga_{0.28}$ (corresponding to FIGS. 2A and 2B), or AlN or $Al_{0.72}Ga_{0.28}$ linearly graded to $Al_{0.6}Ga_{0.4}$ (corresponding to FIGS. 3A and 3B). Also shown as dash lines are the conduction band discontinuities ($\Delta E_c$) between the AlN or $Al_{0.72}Ga_{0.28}$ barrier slab and the $Al_{0.6}Ga_{0.4}$ well layer, respectively. The energy barrier height at interface I1 is calculated as $$\Delta E_c - \frac{e\sigma b}{2\epsilon}$$

and $$\Delta E_c - \frac{e\sigma b}{4\epsilon}$$

for composition constant and Al-composition linearly downgraded barrier slabs, respectively.

Take an AlN barrier slab as an example, even though the conduction band discontinuity between the AlN barrier and $Al_{0.6}Ga_{0.4}$ well is as large as 0.787 eV, due to the polarization voltage increase (refer to eq. (5)), the energy barrier at interface I1 is reduced significantly for thick AlN barriers. For examples, for AlN slab of ~3 nm thick, the barrier height almost vanishes. If the barrier is AlN linearly downgraded to the well $Al_{0.6}Ga_{0.4}$, the energy barrier at interface I1 is still about 0.42 eV for a barrier thickness of 3 nm.

For $Al_{0.72}Ga_{0.28}N$ barrier slabs, the conduction band discontinuity between the barrier and the $Al_{0.6}Ga_{0.4}$ well is about 0.216 eV. The energy barrier heights at interface I1 are about 0.008 and 0.112 eV for the 3-nm-thick composition constant and Al-composition linearly downgraded barrier slabs, respectively.

Figure 5A:
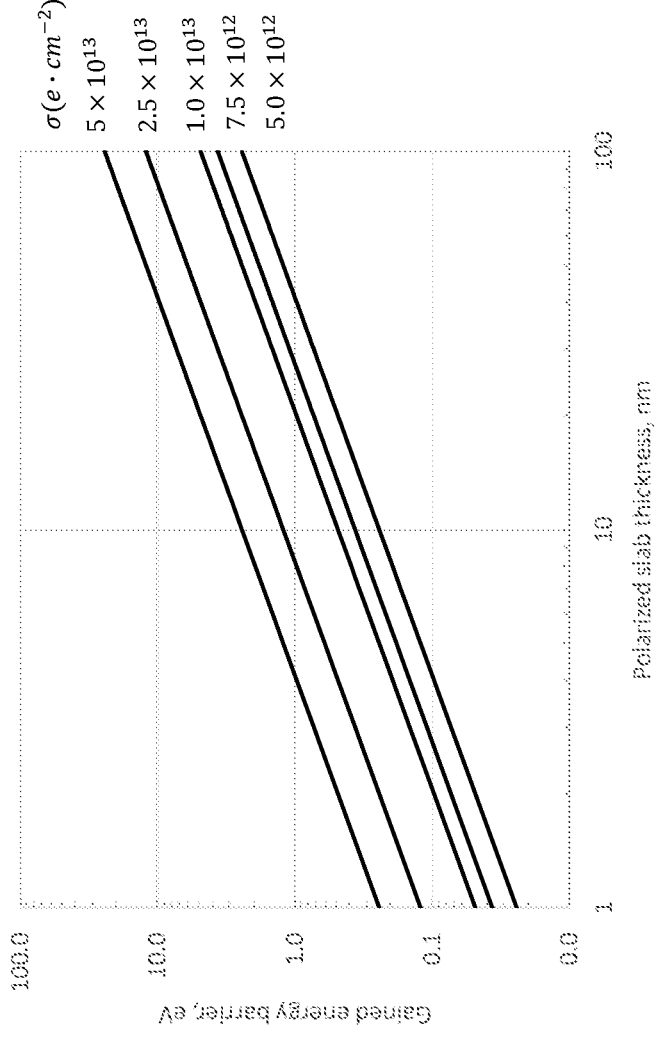
FIG. 5A plots the gained energy barrier heights $\Delta\phi$ for Al-composition linearly downgraded barrier slabs relative to composition constant barrier slabs of different surface charge density and slab thickness.

FIG. 5A plots the gained energy barrier heights $\Delta\phi$ (refer to eq. (7)) for Al-composition linearly downgraded barrier slabs relative to composition constant barrier slabs of different surface charge densities ($5\times10^{12}$-$5\times10^{13}$ e·cm$^{-2}$) and slab thicknesses (1-100 nm). As seen, the gained energy barrier height is proportional to the surface charge density and slab thickness. Depending on the slab thickness and surface charge density, the gained energy barrier can be up to several eV or tens of eV. It is noted that the surface/interface charge density used in the plot, namely, $5\times10^{12}$-$5\times10^{13}$ e·cm$^{-2}$ are readily achievable at the AlGaN/AlGaN heterointerfaces. For example, for a fully strained c-plane AlN thin layer grown on a relaxed GaN template, the interface charge density is about $6.3\times10^{13}$ e·cm$^{-2}$; for a fully strained c-plane AlN thin layer grown on a relaxed $Al_{0.5}Ga_{0.5}N$ template, the interface charge density is about $3.1\times10^{13}$ e·cm$^{-2}$; for a fully strained c-plane $Al_{0.8}Ga_{0.2}N$ thin layer grown on a relaxed $Al_{0.6}Ga_{0.6}N$ template, the interface charge density is about $1.2\times10^{13}$ e·cm$^{-2}$; for a fully strained c-plane $Al_{0.72}Ga_{0.38}N$ thin layer grown on a relaxed $Al_{0.6}Ga_{0.6}N$ template, the interface charge density is about $7.1\times10^{12}$ cm$^{-2}$, et al. In general, for a fully strained c-plane $Al_{x+\Delta x}Ga_{1-(x+\Delta x)}N$ thin layer grown on a relaxed $Al_xGa_{1-x}N$ template, the interface charge density can be approximately given by $\sigma(\Delta x)=6.10\times10^{13} \Delta x$ e·cm$^{-2}$.

Figure 5B:
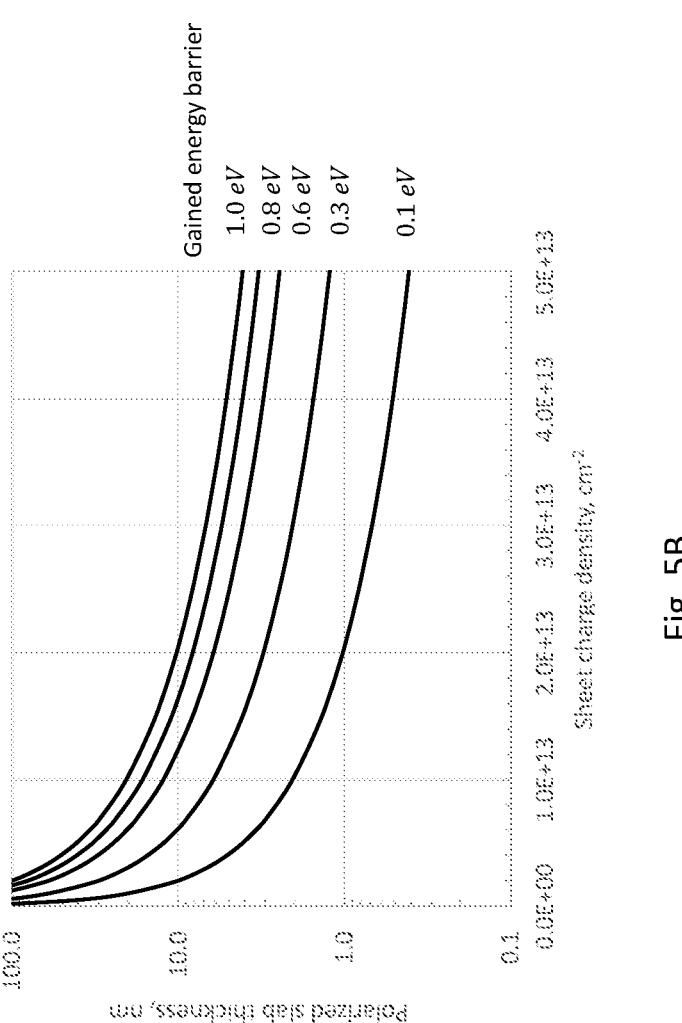
FIG. 5B plots the relationship between the barrier slab thickness and surface sheet charge density for different given gained energy barrier height $\Delta\phi$.

FIG. 5B plots the relationship between the barrier slab thickness and surface sheet charge density for different given gained energy barrier height $\Delta\phi$ for Al-composition linearly downgraded barrier slabs relative to composition constant barrier slabs. Basically, for a given gained energy barrier, the slab thickness needed is inversely proportional to the interface/surface sheet charge density.

Therefore, it is important to reduce the polarization generated voltage within an AlGaN slab if it is used in an EBL structure, as this will increase the electron blocking barrier energy height of the EBL structure. According to one aspect of the present disclosure, two approaches can be applied to reduce the polarization generated voltage within an AlGaN slab. The first approach is to use thin AlGaN slabs in EBL, with slab thickness less than 3 nm, e.g., less than 2 nm, or less than 1 nm. This can be referred to Eqs. (5) and (6), where the polarization generated voltage within the slab increases linearly with the slab thickness. The second approach is to use c-direction Al-composition downgraded AlGaN slabs in EBL if the slab thickness is greater than 3 nm, optionally, to use c-direction Al-composition linearly downgraded AlGaN slabs in EBL if the slab thickness is greater than 3 nm. This can be referred to Eq. (7), which teaches that as compared to a composition-constant AlGaN slab, an Al-composition linearly downgraded (along c-direction) AlGaN slab can gain more electron blocking barrier energy height.

In the following, LED embodiments applied the improved EBL structures according to the principles described above will be given in details.

Illustrated in FIG. 6 is a cross-sectional schematic view of a UV LED structure according to an embodiment of the present invention. The structure starts with a UV transparent substrate 10. Substrate 10 can be selected from sapphire, AlN, SiC, and the like. Formed over substrate 10 is a template 20, which can be made of a thick AlN layer, for example, with a thickness of 0.3-4.0 μm. Even though not shown in FIG. 6, a strain management structure such as an Al-composition grading AlGaN layer or sets of AlN/AlGaN superlattices can be formed over template 20. Formed over template 20 is a thick n-AlGaN structure 30 for electron supply and n-type ohmic contact formation. Structure 30 may include a thick (1.0-5.0 μm such as 2.0 μm, n-type dopant concentration [n]=$2.0\times10^{18}$-$8.0\times10^{18}$ cm$^{-3}$) n-type N—$Al_{x1}Ga_{1-x1}N$ layer 31 for current spreading, a heavily n-type doped (0.2-0.8 μm such as 0.60 μm, [n]=$8\times10^{18}$-$2\times10^{19}$ cm$^{-3}$) N$^+$—$Al_{x2}Ga_{1-x2}N$ n-ohmic contact layer 33 to receive n-ohmic contact, and a lightly doped N$^-$—$Al_{x3}Ga_{1-x3}N$ layer 35 (0.1-0.5 μm such as 0.3 μm, [n]=0-$5\times10^{16}$ cm$^{-3}$) to reduce current crowding, and a heavily n-type doped (5-50 nm such as 20 nm, [n]=$8\times10^{18}$-$2\times10^{19}$ cm$^{-3}$) N$^+$—$Al_{x4}Ga_{1-x4}N$ layer 36 to screen polarization field and prepare uniform current injection into the following $Al_{xb}Ga_{1-xb}N/Al_{xw}Ga_{1-xw}N$ MQW active-region 40. The Al-compositions in the above layers follow the rules: $0.02\leq x1-x2\leq0.06$, $0.06\leq x3-x2\leq0.25$, $x4=x3$, $0\leq x1-xb\leq0.05$, and $0.1\leq xb-xw\leq0.4$; and $0.5\leq x1\leq0.6$ and $0.55\leq x1\leq0.85$ for UVB and UVC LEDs, respectively.

Active-region 40 can be made of alternatingly stacked n-$Al_{xb}Ga_{1-xb}N$ barrier and $Al_{xw}Ga_{1-xw}N$ well for a few times, for example, for 1-8 times. The barrier thickness is in the range of 8-16 nm, and the well thickness is 1.2-5.0 nm. The total thickness of the active-region 40 is usually less than 200 nm, for example, being 75 nm, 100 nm, or 150 nm.

Following the active-region 40 is a p-type AlGaN EBL 50. In general, EBL 50 needs to have enough Al-composition and composition-modulation to allow for sufficient electron blockage and hole injection efficiencies. Further, EBL 50 shall also be efficient in spreading hole current laterally. As EBL 50 is critical to LED's high-current-injection performance, the teachings given above are used to deduce various embodiments of EBL 50 in this disclosure.

The EBL 50 has a first surface proximate to the light-emitting multiple-quantum well active region 40 and a second surface distal to the light-emitting multiple-quantum well active region 40. The first surface has a bandgap larger than a bandgap of the light-emitting multiple-quantum well active region 40 to suppress electron overflow. The second surface has or is proximate to a hole accumulation potential well for reduced hole injection barriers to promote lateral hole current.

Formed on EBL 50 is a p-AlGaN (i.e., $Al_{xt}Ga_{1-xt}N$) transition layer 60, which is a 20-50 nm thick p-type AlGaN layer, with Al-composition (xt) graded down from at least one Al-composition in the EBL 50 to a value slightly higher (e.g., +0.04) than that of the p-AlGaN contact layer 61, which is a 2-8 nm, or 2-6 nm $Al_{xc}Ga_{1-xc}N$ layer, with $0.35 \leq xc \leq 0.50$, e.g., $0.38 \leq xc \leq 0.47$. Contact layer 61 is heavily doped with p-type and n-type dopants, for example, doped with p-type dopant Mg and n-type dopant Si of concentrations in the range of $5 \times 10^{19}$-$2.0 \times 10^{20}$ cm$^{-3}$, e.g., $9 \times 10^{19}$-$1.5 \times 10^{20}$ cm$^{-3}$, respectively.

Referring to FIG. 6, a mesa is etched out to expose the $N^+$—$Al_{x2}Ga_{1-x2}N$ n-ohmic contact layer 33, for deposition of n-ohmic contact 81, which can be made of thin metal layer stacks such as titanium/aluminum/titanium/gold (Ti/Al/Ti/Au) with respective layer thickness of 30-40/70-80/10-20/80-100 nm, for example 35/75/15/90 nm, or V/Al/V/Ag, V/Al/V/Au, and V/Al/Ti/Au, of respective thicknesses such as 20/60/20/100 nm. Overlying n-ohmic contact 81 is n-contact pad 89 made of a thick (2-10 μm) gold or gold tin layer. Formed on the p-AlGaN contact layer 61 is a p-ohmic contact 71, which can be a thin (e.g., 1-100 nm) metallic contact containing elements nickel (Ni), rhodium (Rh) and oxygen (O). Formed on p-ohmic contact 71 is a metal reflector layer 73, which can be selected from metals Al, Pd, Pt, Os, and Rh. Metal reflector layer 73 is preferably thicker than 10 nm, preferably 50 nm-thick, or 100 nm-thick. Optionally, metal reflector layer 73 is UV-reflective, for example, UVC-reflective, to maximize light extraction efficiency. In one embodiment, p-ohmic contact 71 is metal oxide of thickness 0.2-10.0 nm and metal reflector layer 73 is a Rd layer of a thickness 60-70 nm, for example 65 nm. Formed on metal reflector layer 73 is a thick metal layer serving as p-contact pad 79, which can be made of a 2-8 μm gold layer or gold tin layer.

Figure 7:
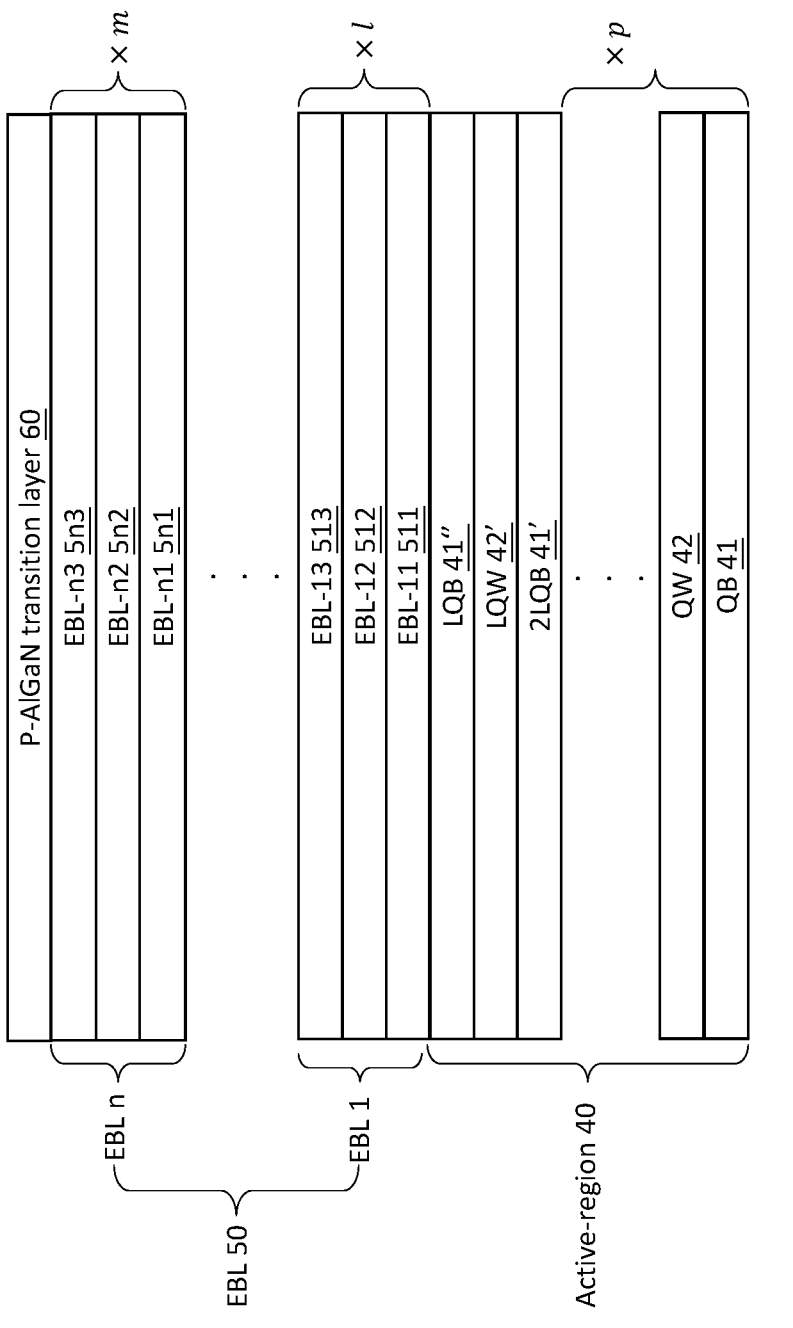
FIG. 7 illustrates a layered structure of a multiple-quantum-well and electron-blocking layer/structure according to one aspect of the present disclosure.

FIG. 7 illustrates a layered structure of an electron-blocking layer/structure EBL 50 formed on a MQW active-region 40. As seen, active-region 40 comprises alternatingly stacked n-$Al_{xb}Ga_{1-xb}N$ barrier QB 41 and $Al_{xw}Ga_{1-xw}N$ well QW 42 for p times, where $p \in [1, 10]$, e.g., the stack of QB 41 and QW 42 repeating 1-10 times. In addition, active-region 40 may also include a light-emitting sandwich structure consisting of a second last quantum barrier 2LQB 41', a last quantum well LQW 42', and a last quantum barrier LQB 41". 2LQB 41' may only differ from QB 41 in terms of doping, for example, QB 41 can be Si-doped while 2LQB 41' is undoped. LQW 42' may be thicker and having slightly different bandgap as compared to QW 42. In some embodiment, LOW 42' can double the thickness of QW 42 and be of slightly less bandgap (e.g., 5-50 meV less). Further, LQB 41" does not have to be of the same thickness, doping and composition as QB 41. LQB 41" is preferably undoped. In some embodiments, LQB 41" is of the same composition as QB 41, but of greater thickness. In some embodiments, LQB 41" is of the same composition as QB 41, but of less thickness. In some embodiments, LQB 41" has a higher Al-composition (higher bandgap) than QB 41, but has less thickness. In one embodiment of a 265 nm LED, QW 42 is an undoped 2.3-nm-thick $Al_{0.45}Ga_{0.55}N$ layer, LQW 42' is an undoped 3.2-nm-thick $Al_{0.43}Ga_{0.57}N$ layer, QB 41 is a Si-doped 10-nm-thick $Al_{0.58}Ga_{0.42}N$ layer, 2LQB 41' is an undoped 10-nm-thick $Al_{0.58}Ga_{0.42}N$ layer, and LQB 41" is a is an undoped 2.5-nm-thick $Al_{0.65}Ga_{0.35}N$ layer.

EBL 50 formed on LQB 41" comprises a few subset EBLs, such as EBL 1, EBL 2, . . . , up to EBL n (where $n \in [1, 5]$), and each subset EBL i consists of a few (e.g., l, m; l, $m \in [1, 5]$) repeating or periodic laminate structure consisting of EBL-i1 511, EBL-i2 512 and EBL-i3 513. When EBL 50 only contains one subset EBL, then the one subset EBL is equivalent to a full EBL 50. For example, subset EBL 1 is made of l periods of a laminate structure consisting of EBL-11 511, EBL-12 512 and EBL-13 513. According to the embodiments disclosed in the present specification, in most of the subset EBL i, layer EBL-i2 512 is mandatory, layers like EBL-i1 5i1 and EBL-i3 5i3 are optional, except that when the thicknesses of layers EBL-i1 5i1 and EBL-i1 5i3 are less than 3 nm then EBL-i2 5i2 is optional. This is because that in view of FIG. 4, when the thicknesses of layers EBL-i1 5i1 and EBL-i1 5i3 are less than 3 nm, the energy barrier height loss due to interface charges is acceptable, for composition-constant barrier/well EBL-i1 5i1/EBL-i1 5i3 EBL.

Figures 8A, 8B:
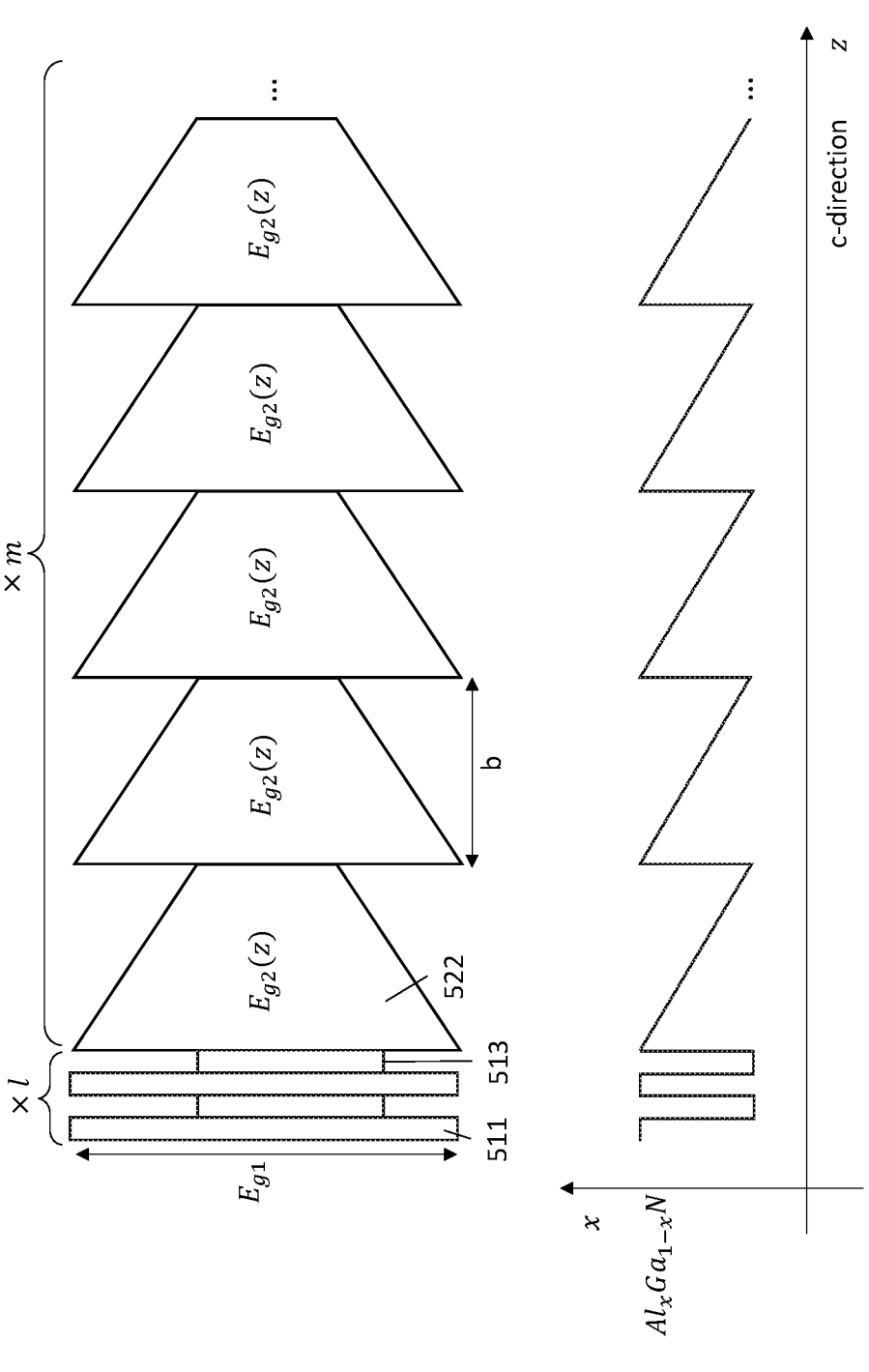
FIG. 8A illustrates a bandgap diagram of an electron blocking layer/structure according to one aspect of the present disclosure.
FIG. 8B illustrates the Al-composition profile of the electron blocking layer/structure shown in FIG. 8A.

According to one aspect of the present disclosure, a bandgap diagram ($E_g = E_c - E_v$) and a corresponding Al-composition profile of an EBL 50 are illustrated in FIGS. 8A and 8B, respectively. As seen, The EBL contains at least two subset EBLs: EBL 1 and EBL 2, where EBL 1 is made of l pairs (e.g., $l \in [1, 10]$) of composition-constant barrier/well stack of EBL- 11 511/EBL-13 513. In this embodiment, the thicknesses of EBL-11 511 and EBL-13 513 are not to be larger than 3 nm (here EBL-12 512 vanishes). In this case, EBL 1 is said to be made of l periods short period superlattice (SPSL) of EBL-11 511/EBL-13 513. Also noted, that the Al-composition of EBL-11 511 can optionally be downgraded (e.g., linearly downgraded) to that of EBL-13 513. Further, EBL 2 is made of m pairs (e.g., $m \in [1, 10]$) of bandgap linearly downgraded (hence Al-composition linearly downgraded AlGaN) EBL-22 522. As shown, the bandgap (hence the Al-composition) of EBL-22 522 is linearly downgraded from that of EBL-11 511 to that of EBL-13 513 within a thickness b. In general, provided that EBL-22 522 is transparent to the emissions from the active-region 40, the Al composition of EBL-22 522 can also be monotonically graded down from a value to another lower value along the growth direction. The Al-composition (hence the bandgap) of EBL-13 513 is optionally close or equal to that (xb) of the QB 41 (e.g., $xb \in [0.4, 0.7]$ for UVB and UVC LEDs), and the Al-composition of EBL-11 511 is optionally much higher than that of the QB 41, e.g., in the range of [xb+0.05, xb+0.35], or [xb+0.1, xb+0.25], e.g., in the range of 0.45-1.0. The thickness b for EBL-22 522 is optionally in the range of 3-10 nm, or 4-8 nm.

It is further noted, that another embodiment EBL 50 can be made of repeating the EBL structure shown in FIG. 8A for a few times, e.g., 2-5 times.

Figures 9A, 9B:
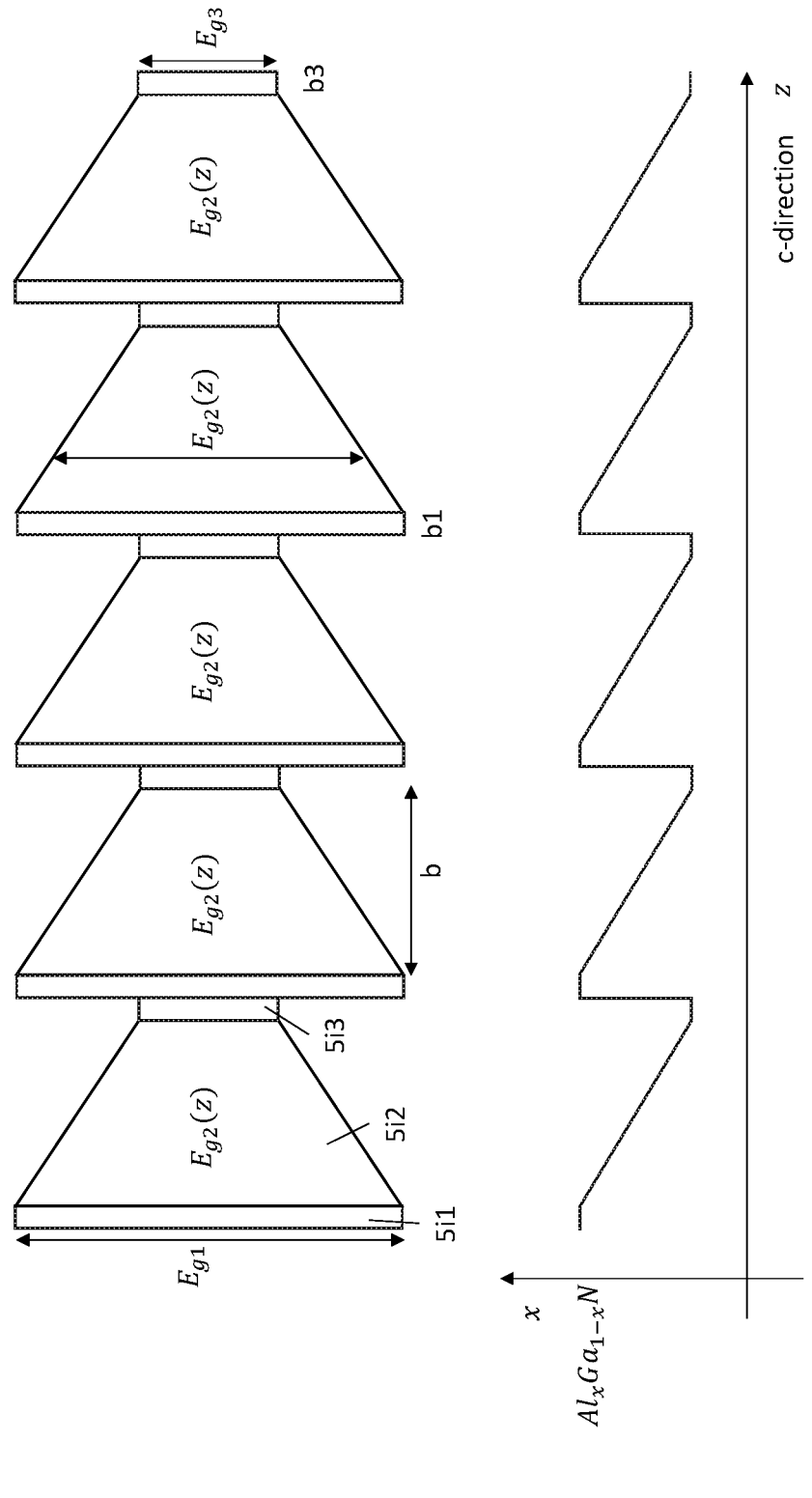
FIG. 9A illustrates a bandgap diagram of an electron blocking layer/structure according to one aspect of the present disclosure.
FIG. 9B illustrates the Al-composition profile of the electron blocking layer/structure shown in FIG. 9A.
Figures 10A, 10B:
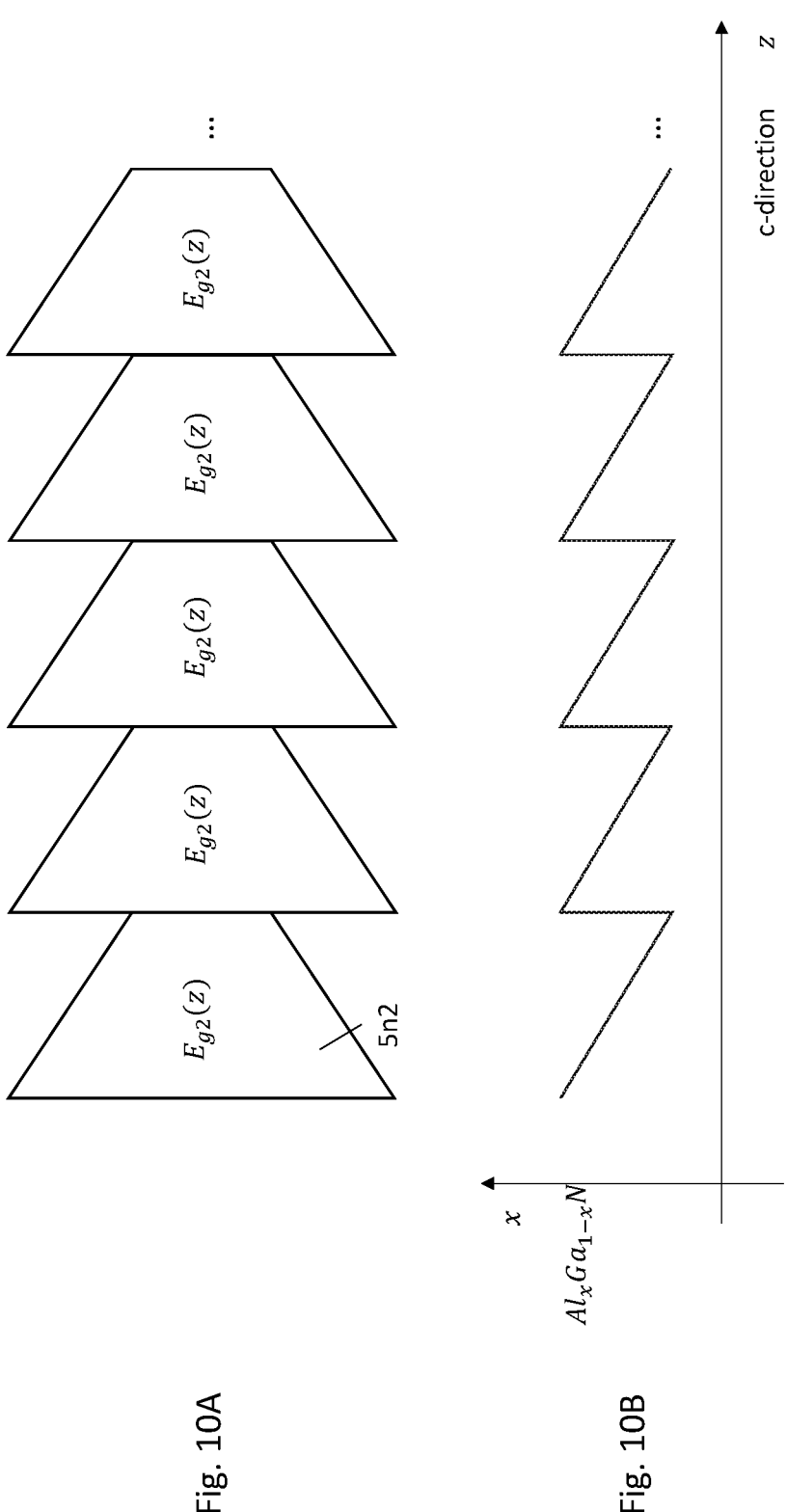
FIG. 10A illustrates a bandgap diagram of an electron blocking layer/structure according to one aspect of the present disclosure.
FIG. 10B illustrates the Al-composition profile of the electron blocking layer/structure shown in FIG. 10A.
Figures 11A, 11B:
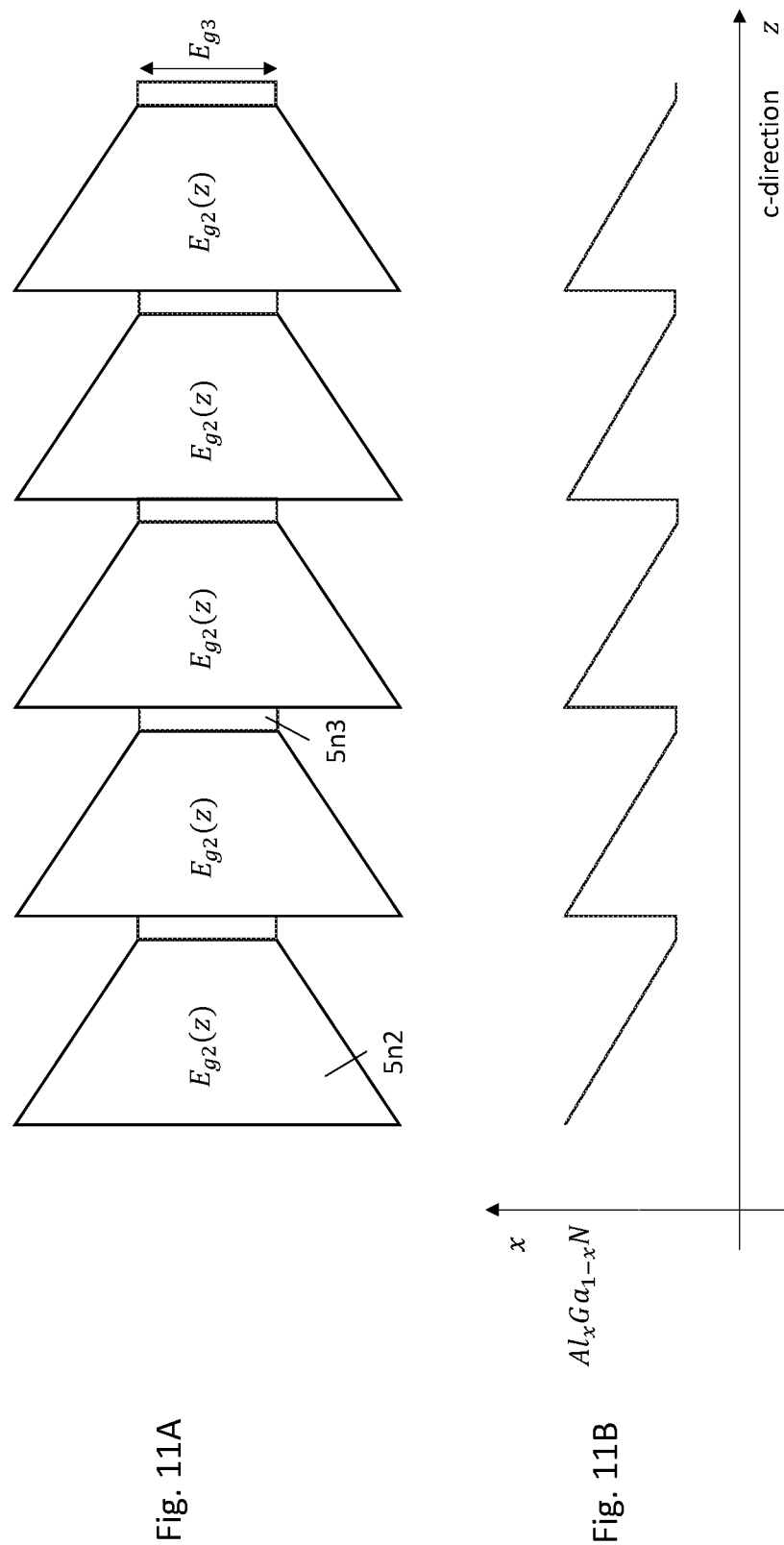
FIG. 11A illustrates a bandgap diagram of an electron blocking layer/structure according to one aspect of the present disclosure.
FIG. 11B illustrates the Al-composition profile of the electron blocking layer/structure shown in FIG. 11A.
Figures 12A, 12B:
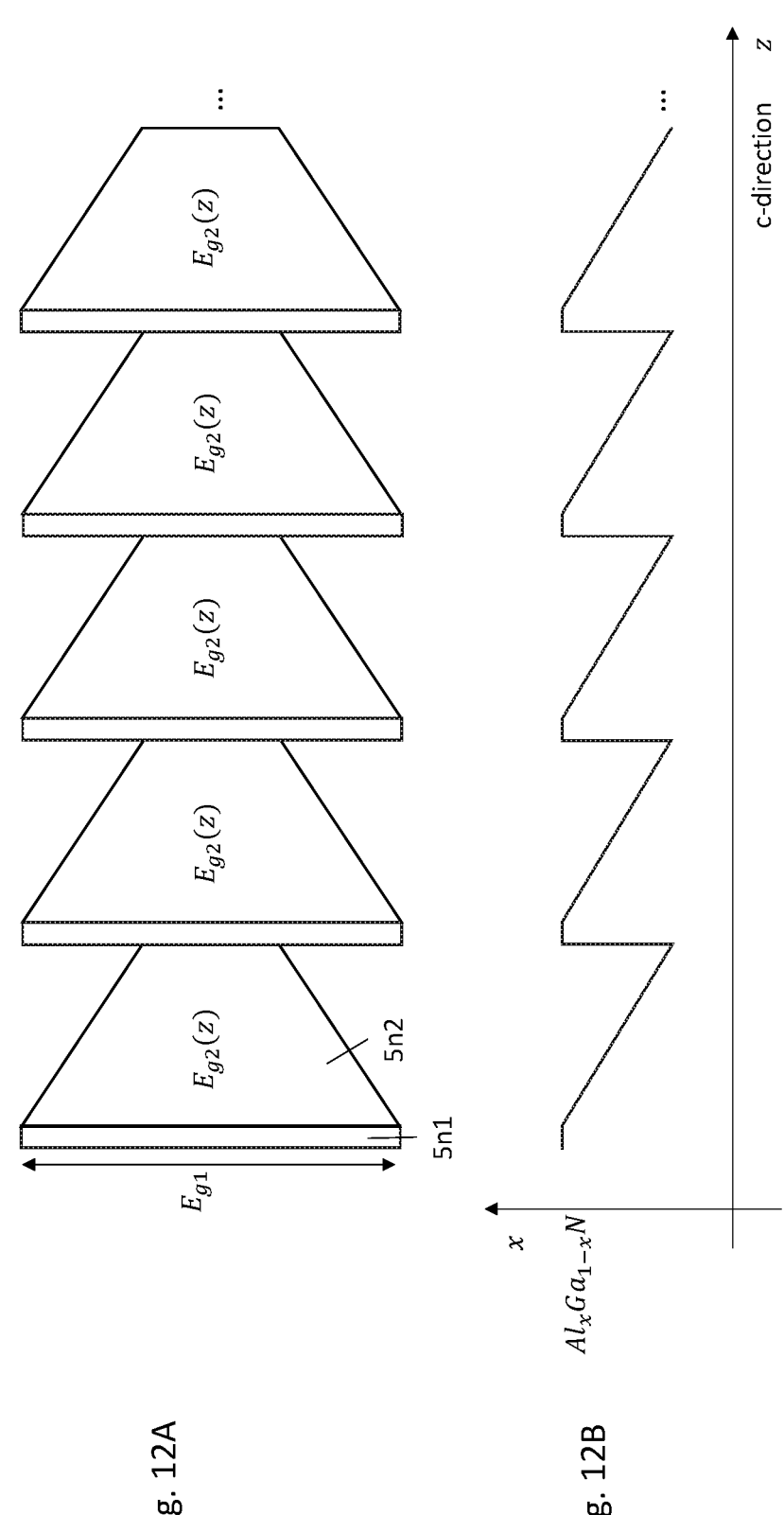
FIG. 12A illustrates a bandgap diagram of an electron blocking layer/structure according to one aspect of the present disclosure.
FIG. 12B illustrates the Al-composition profile of the electron blocking layer/structure shown in FIG. 12A.

According to another aspect of the present disclosure, a bandgap diagram ($E_g = E_c - E_v$) and a corresponding Al-composition profile of a subset EBL are illustrated in FIGS. 9A and 9B, respectively. The subset EBL is made of repeating (a few times, i.e., 1-5 times) a laminate structure consisting of EBL layers EBL-i1 511, EBL-i2 512 and EBL-i3 513. As shown, EBL-i1 5i1 and EBL-i3 5i3 are of constant compositions (bandgap), respectively, EBL-i2 5i2 is bandgap linearly downgraded (hence Al-composition linearly downgraded) from that of the EBL-i1 5i1 to that of EBL-i3 5i3, within a thickness b. In general, provided that EBL-i2 5i2 is transparent to the emissions from the active-region 40, the Al composition of EBL-i2 5i2 can also be monotonically graded down from a value to another lower value along the growth direction. The Al-composition (hence the bandgap) of EBL-i3 5i3 is optionally close or equal to that (xb) of the QB 41, and the Al-composition of EBL-i1 5i1 is optionally much higher than that of the QB 41, e.g., in the range of [xb+0.05, xb+0.35], or [xb+0.1, xb+0.25]. The thickness b for EBL-i2 $5i2$ is optionally in the range of 3-10 nm, or 4-8 nm. The thicknesses of EBL-i1 $5i1$ and EBL-i3 $5i3$ are b1 and b3, respectively, to be in the range of 0-6 nm. When b1=b3=0, the bandgap diagram and the Al-composition profile of the subset EBL are illustrated in FIGS. 10A and 10B, respectively; when b1=0, the bandgap diagram and the Al-composition profile of the subset EBL are illustrated in FIGS. 11A and 11B, respectively; when b3=0, the bandgap diagram and the Al-composition profile of the subset EBL are illustrated in FIGS. 12A and 12B, respectively.

An EBL 50 can be made of one or several (e.g., 2-5) subsets EBL illustrated in FIGS. 9A-12A. When EBL 50 is made of several subsets EBL illustrated in FIGS. 9A-12A, each subset can have its own Al-composition profile, being the same to, or different from that of another subset. The first subset EBL can optionally be undoped, whereas the rest subsets EBL are Mg-doped, optionally with increasing Mg concentration as the growth front continues to move away from the active-region 40.

The various EBL 50 structures designed according to the present disclosure have improved electron blocking barriers and reduced hole injection barriers, hence are important to the LED high-current-density performance characteristics, such as efficiency and lifespan.

Example 1

A UVC 265 nm LED wafer in the present disclosure is made using Metal Organic Chemical Vapor Deposition (MOCVD) according to the epitaxial structures shown in FIGS. 6 and 7. C-plane sapphire is used as substrate 10, with a 3.5 μm-thick AlN serving as AlN template 20. The N—AlGaN layer 31 is made of a 2.1 μm-thick $Al_{0.62}Ga_{0.38}N$ doped with n-dopant Si to a level of $6.5 \times 10^{18}$ cm$^{-3}$, and the $N^+$—$Al_{0.57}Ga_{0.43}N$ layer 33 is 400-nm-thick and doped with Si of $7.5 \times 10^{18}$ cm$^{-3}$. The $N^-$—AlGaN layer 35 is a 150-nm-thick undoped AlGaN layer of Al-composition of 0.75, and the $N^+$—$Al_{0.75}Ga_{0.25}N$ layer 36 is 10-nm-thick and doped with Si of $1.2 \times 10^{19}$ cm$^{-3}$. The active-region 40 used is a five-pair multiple-quantum-well, with the quantum barrier thickness and Al-composition to be 11.0 nm and 0.59, and the well thickness and Al-composition to be 2.5 nm and 0.43, respectively. The last quantum barrier 41" is 2.5-nm-thick undoped $Al_{0.62}Ga_{0.38}N$ layer. Further, the quantum wells and the second last quantum barrier (2LQB 41') are undoped, and the other quantum barriers are doped with Si at $3.0 \times 10^{18}$ cm$^{-3}$. The EBL 50 used consists of 4 EBL subsets, namely, EBL 1, EBL 2, EBL 3 and EBL 4. EBL 1 is undoped, including 4 pairs of a laminate structure consisting of a 1-nm-thick $Al_{0.72}Ga_{0.28}N$ layer (EBL-11 511) and a 1-nm-thick $Al_{0.6}Ga_{0.4}N$ layer (EBL-13 513). EBL 2 is Mg-doped (1.0-3.0×$10^{18}$ cm$^{-3}$), including 3-pairs of a laminate structure made of 2-nm-thick $Al_{0.72}Ga_{0.28}N$ layer (EBL-21 521)) followed by a 6-nm-thick $Al_xGa_{1-x}N$ layer (EBL-22 522), where x is linearly graded from 0.72 to 0.54. EBL 3 is doped with Mg around 3.0-5.0×$10^{18}$ cm$^{-3}$, including 2-pairs of a laminate structure made of 2-nm-thick $Al_{0.67}Ga_{0.33}N$ layer (EBL-31 531) followed by a 6-nm-thick $Al_xGa_{1-x}N$ layer ((EBL-32 532)), where x is linearly graded from 0.67 to 0.61. EBL 4 is doped with Mg around 4.0-5.0×$10^{18}$ cm$^{-3}$, including 3-pairs of a laminate structure made of 2-nm-thick $Al_{0.69}Ga_{0.31}N$ layer (EBL-41 541) followed by a 6-nm-thick $Al_xGa_{1-x}N$ layer (EBL-42 542), where x is linearly graded from 0.69 to 0.61. Transition layer 60 is a 42-nm-thick p-type AlGaN layer, with Al-composition graded down from 0.61 to 0.48 and doped with Mg exponentially increasing from 0.3-10×$10^{19}$ cm$^{-3}$. The p-Al- GaN contact layer 61 is a 4-nm-thick $Al_{0.43}Ga_{0.57}N$ layer, doped with Mg and Si of concentrations of $2.0 \times 10^{20}$ cm$^{-3}$ and $1.2 \times 10^{20}$ cm$^{-3}$, respectively.

Example 2

Another 265 nm UVC LED wafer in the present disclosure is made using Metal Organic Chemical Vapor Deposition (MOCVD) according to the epitaxial structures shown in FIGS. 6 and 7. C-plane sapphire is used as substrate 10, with a 3.5 μm-thick AlN serving as AlN template 20. The N—AlGaN layer 31 is made of a 2.1 μm-thick $Al_{0.62}Ga_{0.38}N$ doped with n-dopant Si to a level of $6.5 \times 10^{18}$ cm$^{-3}$, and the $N^+$—$Al_{0.57}Ga_{0.43}N$ layer 33 is 400-nm-thick and doped with Si of $7.5 \times 10^{18}$ cm$^{-3}$. The $N^-$—AlGaN layer 35 is a 150-nm-thick undoped AlGaN layer of Al-composition of 0.75, and the $N^+$—$Al_{0.75}Ga_{0.25}N$ layer 36 is 10-nm-thick and doped with Si of $1.2 \times 10^{19}$ cm$^{-3}$. The active-region 40 used is a five-pair multiple-quantum-well, with the quantum barrier thickness and Al-composition 11.0 nm and 0.59, and the well thickness and Al-composition 2.5 nm and 0.43, respectively. The last quantum barrier 41" is 2.5-nm-thick undoped $Al_{0.62}Ga_{0.38}N$ layer. Further, the quantum wells and the second last quantum barrier (2LQB 41') are undoped, and the other quantum barriers are doped with Si at $3.0 \times 10^{18}$ cm$^{-3}$. The EBL 50 has 4 EBL subsets, namely, EBL 1, EBL 2, EBL 3 and EBL 4. EBL 1 is undoped, including a 2-nm-thick $Al_{0.72}Ga_{0.28}N$ layer (EBL-11 511) and a 6-nm-thick AlGaN layer (EBL-12 512) with Al-composition linearly graded from 0.72 to 0.54. EBL 2 is Mg-doped (1.0-3.0×$10^{18}$ cm-3), including 3-pairs of a laminate structure made of 2-nm-thick $Al_{0.72}Ga_{0.28}N$ layer (EBL-21 521)) followed by a 6-nm-thick $Al_xGa_{1-x}N$ layer (EBL-22 522), where x is linearly graded from 0.72 to 0.54. EBL 3 is doped with Mg around 3.0-5.0×$10^{18}$ cm$^{-3}$, including 2-pairs of a laminate structure made of 2-nm-thick $Al_{0.67}Ga_{0.33}N$ layer (EBL-31 531) followed by a 6-nm-thick $Al_xGa_{1-x}N$ layer ((EBL-32 532)), where x is linearly graded from 0.67 to 0.61. EBL 4 is doped with Mg around 4.0-5.0×$10^{18}$ cm$^{-3}$, including 3-pairs of a laminate structure made of 2-nm-thick $Al_{0.69}Ga_{0.31}N$ layer (EBL-41 541) followed by a 6-nm-thick $Al_xGa_{1-x}N$ layer (EBL-42 542), where x is linearly graded from 0.69 to 0.61. Transition layer 60 is a 42-nm-thick p-type AlGaN layer, with Al-composition graded down from 0.61 to 0.48, and doped with Mg exponentially increasing from 0.3-10×$10^{19}$ cm$^{-3}$. The p-AlGaN contact layer 61 is a 4-nm-thick $Al_{0.43}Ga_{0.57}N$ layer, doped with Mg and Si of concentrations of $2.0 \times 10^{20}$ cm$^{-3}$ and $1.2 \times 10^{20}$ cm$^{-3}$, respectively.

UVC LEDs are made from this wafer using the standard LED process and flip-chip packaging. And the high-current-density performance is compared to that of a conventional UVC LED, namely, a UVC LED of a conventional EBL structure with 6 pairs of 6 nm/2 nm $Al_{0.7}Ga_{0.3}N$/$Al_{0.55}Ga_{0.45}N$ composition-constant barrier/well laminate.

Figure 13:
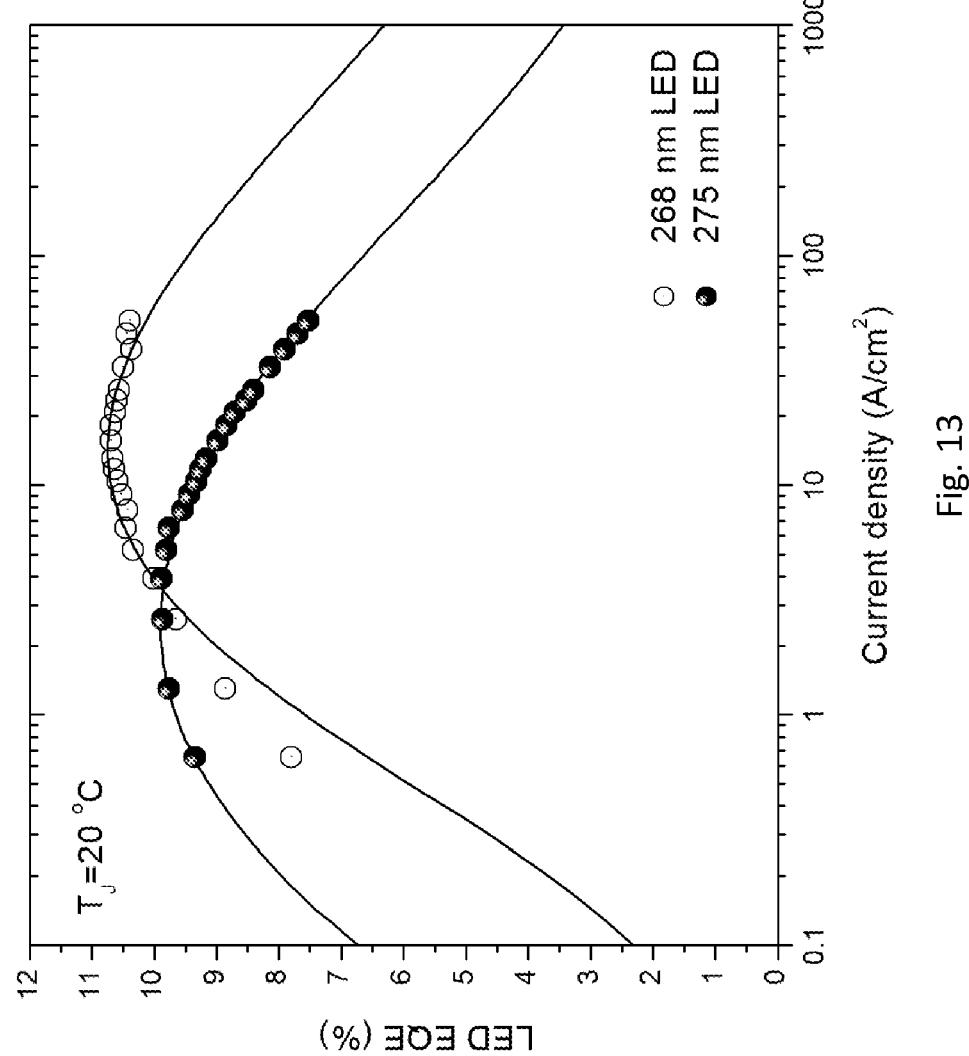
FIG. 13 compares the external-quantum-efficiency versus current-density curves of UVC LEDs with and without an electron blocking layer/structure disclosed in the present disclosure.

FIG. 13 compares the external-quantum-efficiency (EQE) vs current-density curve of a 265 nm UVC LED with the EBL 50 described in Example 2 to that of a 275 nm UVC LED with the conventional EBL (described above). As seen, the low-current-density EQE of the conventional UVC LED (solid circles) is impressive, reaching ~10% at ~2 A/cm$^2$, however, its EQE drops quickly as the current density exceeds 10 A/cm$^2$ (~7% at 70 A/cm$^2$). In contrast, the UVC LED according to the embodiment given in Example 2 (open circles) maintains high EQE (10-11%) for current densities in the range of 5-70 A/cm$^2$.

The present disclosure has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

The invention claimed is:

1. A light emitting diode, comprising:
a substrate;
a group III nitride layer over the substrate for electron supply and n-type ohmic contact formation;
a light-emitting multiple-quantum well active region over the group III nitride layer;
an electron blocking layer over the light-emitting multiple-quantum well active region, the electron blocking layer having a first surface proximate to the light-emitting multiple-quantum well active region and a second surface distal to the light-emitting multiple-quantum well active region, the first surface having a bandgap larger than a bandgap of the light-emitting multiple-quantum well active region to suppress electron overflow and the second surface being proximate to a hole accumulation potential well for reduced hole injection barriers to promote lateral hole current;
a p-contact layer positioned above the electron blocking layer; and
a p-contact pad positioned above the p-contact layer;

wherein the electron blocking layer comprises:
a periodic structure made of an $Al_xGa_{1-x}N$ barrier layer and an $Al_yGa_{1-y}N$ well layer; and
a laminate comprising an $Al_{x'}Ga_{1-x'}N$ layer of thickness b1, an Al-composition downgraded $Al_{z'}Ga_{1-z'}N$ layer of thickness b, and an $Al_{y'}Ga_{1-y'}N$ layer of thickness b3, where b is greater than each of b1 and b3;
where y and y'∈[0.4, 0.7], x and x'∈[0.45, 1.0], x>y, x'>y', and z' decreases from x' to y' along the direction pointing from the $Al_{x'}Ga_{1-x'}N$ layer to the $Al_{y'}Ga_{1-y'}N$ layer.

2. The light emitting diode of claim 1, where the thicknesses of the $Al_xGa_{1-x}N$ barrier layer and $Al_yGa_{1-y}N$ well layer are each less than 3 nm.

3. The light emitting diode of claim 1, where the thicknesses of the $Al_xGa_{1-x}N$ barrier layer and $Al_yGa_{1-y}N$ well layer are each less than 2 nm.

4. The light emitting diode of claim 1, where the thicknesses of the $Al_xGa_{1-x}N$ barrier layer and $Al_yGa_{1-y}N$ well layer are each less than 1 nm.

5. The light emitting diode of claim 1, where b is in the range of 3-10 nm, b1 and b3 are each in the range of 0-6 nm.

6. The light emitting diode of claim 1, where the electron blocking layer has a periodic structure with 0-10 periods, and the laminate repeats 1-10 times.

7. The light emitting diode of claim 1 wherein the electron blocking layer has a higher Al composition than the light-emitting multiple-quantum well active region.

8. The light emitting diode of claim 1 further comprising an AlN template positioned over the substrate.

9. The light emitting diode of claim 8 further comprising a strain management structure positioned over the AlN template.

* * * * *